United States Patent
Hoke et al.

(10) Patent No.: US 6,818,928 B2
(45) Date of Patent: Nov. 16, 2004

(54) QUATERNARY-TERNARY SEMICONDUCTOR DEVICES

(75) Inventors: William E. Hoke, Wayland, MA (US); Peter S. Lyman, Mendon, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/310,207

(22) Filed: Dec. 5, 2002

(65) Prior Publication Data

US 2004/0108574 A1 Jun. 10, 2004

(51) Int. Cl.⁷ ............ H01L 31/0328; H01L 31/0336; H01L 31/072; H01L 31/109; H01L 35/26
(52) U.S. Cl. ............ 257/191; 257/190; 257/192; 257/194
(58) Field of Search ............ 257/190–192, 257/194, 615

(56) References Cited

U.S. PATENT DOCUMENTS

| | | | | |
|---|---|---|---|---|
| 5,523,589 A | * | 6/1996 | Edmond et al. | 257/77 |
| 5,592,501 A | * | 1/1997 | Edmond et al. | 372/45 |
| 5,770,868 A | * | 6/1998 | Gill et al. | 257/190 |
| 6,107,652 A | * | 8/2000 | Scavennec et al. | 257/184 |
| 6,130,147 A | * | 10/2000 | Major et al. | 438/604 |
| 6,342,405 B1 | * | 1/2002 | Major et al. | 438/46 |
| 2002/0149032 A1 | * | 10/2002 | Ouchi et al. | 257/194 |
| 2002/0150137 A1 | * | 10/2002 | Beam, III et al. | 372/49 |
| 2002/0185655 A1 | * | 12/2002 | Fahimulla et al. | 257/192 |

FOREIGN PATENT DOCUMENTS

EP          1249906 A2  * 12/2002  ........... H01S/5/343

* cited by examiner

Primary Examiner—Mary Wilczewski
Assistant Examiner—Monica Lewis
(74) Attorney, Agent, or Firm—Daly, Crowley & Mofford, LLP

(57) ABSTRACT

A semiconductor structure is provided having a III–V substrate, a buffer layer over the substrate, such buffer layer having a compositional graded quaternary lower portion and a compositional graded ternary upper portion. In one embodiment, the lower portion of the buffer layer is compositional graded AlGaInAs and the upper portion is compositional graded AlInAs.

6 Claims, 2 Drawing Sheets

QUATERNARY-TERNARY SEMICONDUCTOR DEVICES

TECHNICAL FIELD

This invention relates to semiconductor devices, and more particularly to semiconductor devices having III–V substrates.

BACKGROUND

As is known in the art, for high quality semiconductor devices, such as field effect transistor (FET) devices, the critical active layers of such devices must lattice-match the underlying substrate to prevent the formation of active device degrading dislocations. This requirement is severe since even a 1% lattice mismatch can cause dislocations and there are few lattice matching material combinations available to the designer. An approach that relieves this requirement is to insert a metamorphic buffer layer between the substrate and critical active device layers. The metamorphic buffer layer is used to alter the lattice constant from that of the substrate. The defects and dislocations necessarily formed in the metamorphic buffer layer to transform the lattice constant are primarily confined to the buffer layer. Subsequently the active device layers are grown on top of a material, i.e., the metamorphic buffer layer, with a new lattice constant.

More particularly, a metamorphic buffer layer grown on a GaAs substrate is used to expand the lattice constant from that of the GaAs crystal substrate thereby enabling the growth of high quality active device structures which are not possible with direct growth on such GaAs substrates. This metamorphic buffer layer is typically an arsenide alloy containing aluminum, gallium, and indium. The concentration of indium is increased during growth to expand the lattice constant. Typically, current practice is to use an $In_xAl_{1-x}As$ or quaternary $In_x(Al_yGa_{1-y})_{1-x}As$ alloys. (The GaInAs ternary alloy is not used because its low bandgap results in electrically leaky buffer layers.) Two problems are encountered with this current practice. With the highly resistive ternary AlInAs buffer layer, the growth must start with a very high aluminum concentration (approximately 95%). The indium concentration is then ramped up while the aluminum concentration is ramped down. The high aluminum concentration roughens the surface morphology which can degrade device performance. With the quaternary AlGaInAs buffer layer, lower aluminum concentrations (approximately 40%) can be used at the start of the growth due to the presence of gallium which smoothens the surface. However, by the end of the compositional ramp, the bandgap of the AlGaInAs material is significantly reduced by the indium and gallium concentrations thereby reducing desireable insulating characteristics of the layer. This problem becomes increasingly severe for indium concentrations greater than 50%.

Thus, since AlAs and GaAs lattice match to 0.1%, the lattice constant is expanded by incorporating indium. During metamorphic buffer layer growth, the indium concentration is increased either linearly or step-fashion, necessarily forming dislocations as the lattice constant expands. When properly grown, the dislocations are predominantly contained in the buffer layer and do not extend into the material grown on top of the buffer layer. A common example is to grade the indium concentration to 52%, giving $In_{0.52}Al_{0.48}As$ or $In_{0.52}(Al_yGa_{1-y})As$. This composition has a lattice constant matching InP. Consequently device structures previously grown on expensive and fragile InP substrates can be grown on GaAs substrates.

The conventional practice for arsenide-based metamorphic buffer layers uses AlInAs or AlGaInAs alloys. As noted above, a problem with AlInAs is the surface morphology of the metamorphic buffer is rougher than with AlGaInAs. AlInAs is an alloy of AlAs and InAs. Material quality of AlAs is improved at high growth temperatures (700C) whereas InAs is improved at low temperatures (400C). Consequently in ramping the Al/In composition from high/low to low/high a complicated temperature ramp is used with limited success in smoothening the surface. A problem with using AlGaInAs in the buffer layer is that the resistivity of the layer and consequently its isolating properties decreases as the indium concentration is ramped up. Low growth temperatures are often used to improve the resistivity by introducing traps or defects into the material. However, these layer imperfections may degrade device layers grown on top of the buffer layer.

One method used to provide a metamorphic buffer layer is illustrated for the growth of InP-type device structure on a GaAs substrate by using 52% indium concentration in the buffer layer. Other indium concentrations and device structures are possible. The specific example of a layer structure of the metamorphic includes: a GaAs substrate; a GaAs buffer on the substrate; a 1.62 μm metamorphic buffer layer linearly indium graded over a thickness of 1.5 μm from In0.06Al0.40Ga0.54As at the bottom (i.e., on the GaAs buffer) to In0.56Al0.40Ga0.04As followed by 0.12 μm grading to In0.52Al0.48As at the top of the metamorphic buffer layer; and a 1000 Å $In_{0.52}Al_{0.48}As$ layer on the metamorphic buffer layer. It is understood that the metamorphic buffer layer is typically between 1.0 and 1.8 μm thick. The active device layers are then formed on the $In_{0.52}Al_{0.48}As$ layer.

SUMMARY

In accordance with the present invention, a semiconductor structure is provided having a III–V substrate, a buffer layer over the substrate, such buffer layer having a compositionally graded quaternary lower portion and a compositionally graded ternary upper portion.

In one embodiment, the lower portion of the buffer layer is compositional graded AlGaInAs and the upper portion is compositional graded AlInAs.

In one embodiment, the lower portion of the buffer layer has approximate concentrations of 5% indium, 40% aluminum, and 55% gallium, (i.e., Al0.40In0.05Ga0.55As This concentration of aluminum insures good layer resistivity while the gallium concentration smoothens the surface.

In one embodiment, the indium concentration is increased (i.e., ramped up) and the gallium concentration is decreased (i.e., ramped down) from a bottom of the lower portion to a top of the lower portion of the buffer layer. At an indium concentration of approximately 25–35%, the gallium is terminated and a ternary AlInAs upper layer is grown. The resistivity of Al0.7In0.3As is very good with satisfactory smoothness. The indium concentration is then ramped up toward the final desired composition.

In a preferred embodiment, the indium concentration is graded 3–10% beyond the desired final indium concentration to relax residual strain. From this compositional overshoot, the indium concentration is then ramped back down to the final indium concentration. This grading approach results in excellent buffer layer resistivity with good surface smoothness for the commonly used 52% indium concentration.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
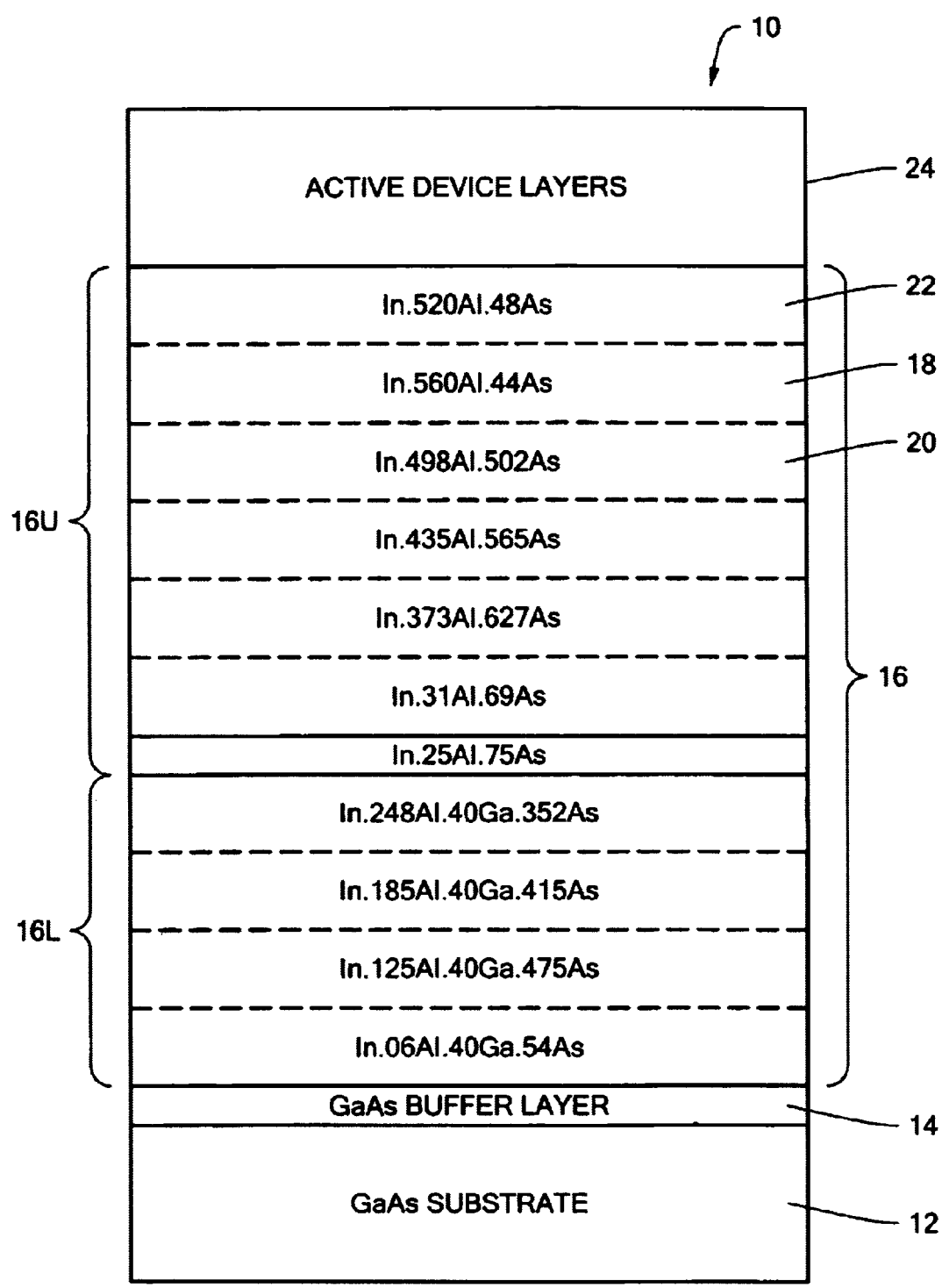
FIG. 1 is a sketch showing layers on a substrate having a metamorphic buffer layer according to the invention.

Referring now to FIG. 1, a semiconductor structure 10 is shown having a III–V substrate 12, here a 600 μm GaAs substrate. A buffer layer 14 is formed on the substrate 12. Here, such buffer layer 14 has; a 500 Å GaAs layer; a 5-period superlattice consisting of 20 Å Al0.4Ga0.6As and 20 Å GaAs; and a 400 Å GaAs upper portion. The number of periods, layer thicknesses, and AlGaAs composition in the superlattice are not critical.

Next, a metamorphic buffer layer 16 is formed on buffer layer 14. The metamorphic buffer layer 16 has a compositionally graded quaternary lower portion 16L and a compositionally graded ternary upper portion 16U. More particularly, the lower portion 16L is formed in a manner to be described with the following compositional grade beginning closest to the buffer layer 14 and extending upwardly: a starting composition of In.06Al.40Ga.54As; a 1875 Å thick layer graded to In.125Al.40Ga.475As; a 1875 Å thick layer graded to In.185Al.40Ga.415As and 1875 Å thick layer graded to In.248Al.40Ga.352As. The grading is continuous and linear.

Next, the introduction of Ga is terminated. The growth is interrupted. The furnace conditions are set and the Al, In, and As are introduced to form a ternary growth with a starting layer of In.25Al.75As on the In.248Al.40Ga.352As. Thus, the upper portion 16U of the metamorphic buffer layer 16 is formed in a manner to be described with the following compositional grade beginning closest to the final quaternary composition of In.248Al.40.352GaAs with a starting, ternary composition of In0.25Al0.75As and continuously linearly graded over 1875 Å to In.310Al.69As; a 1875 Å thick layer graded to In.373Al.627As; a 1875 Å thick layer graded to In.435Al.565As; a 1875 Å thick layer graded to In.498Al.502As; a 1875 Å thick layer graded to In.560Al.44As; and a 1200 Å thick layer graded to In.520Al.48As. It is noted that there is a compositional overshoot in the next to the last layer 18. That is, the compositional grade for the last three layers goes from In.498Al502As for layer 20 to In.560Al.44As for layer 18 to In.520Al48As for layer 22. That is, the indium concentration is then ramped back down to the final indium concentration at layer 22. This grading approach results in excellent buffer layer resistivity and good surface flatness for the commonly used 52% indium concentration.

The following TABLE I provides the steps used to form the structure where: "TC manip (degrees C.)" is the temperature of the substrate control thermocouple. It is first noted that the compositional ramping is linear and continuous over distance or growth height.

TABLE I

| Combination Quaternary/Ternary Buffer | TC manip |
|---|---|
| 500Å GaAs | 645 |
| 20Å Al.43GaAs 5x SL | 615 |
| 20Å GaAs 5x SL | 615 |
| 400Å GaAs | 540 |
| start grade: In.06Al.40Ga.54As | 540 |
| grade 1: 1875Å to In.125Al.40Ga.475As | 490 |
| grade 2: 1875Å to In.185Al.40Ga.515As | 420 |
| grade 3: 1875Å to In.248Al.40Ga.352As | 350 |
| terminate Ga and form a starting layer of In.25.Al.75As | |
| grade 4: 1875Å to In.310Al.69As | 420 |
| grade 5: 1875Å to In.373Al.627As | 390 |
| grade 6: 1875Å to In.435Al.565As | 390 |
| grade 7: 1875Å to In.498Al.502As | 390 |
| grade 8: 1875Å to In.560Al.44As | 390 |
| grade 9: 1200Å to In.520Al.48As | 390 |
| 1000Å In.52Al.48As | 515 |
| 200Å In.60Ga.40As | 515 |
| 40Å In.52Al.48As | 515 |
| Si pulse ~ 4.5E12 cm$^{-2}$ | 575 |
| 140Å In.40Al.60As | 575 |
| 100Å In.53Al.47As | 555 |
| 300Å N = 5E18 In.53Ga.47As | 520 |

Having formed the metamorphic buffer layer 16 after completion of grade 9 in the TABLE I above, active device layers 24 are formed on such metamorphic buffer layer 16 as shown in TABLE I.

Devices made with the process described in TABLE I above were compared with devices made in accordance with the process described in TABLE II below:

TABLE II

| All Quaternary Buffer | TC manip (° C.) |
|---|---|
| 500Å GaAs | 645 |
| 20Å Al.43GaAs 5x SL | 615 |
| 20Å GaAs 5x SL | 615 |
| 400Å GaAs | 540 |
| start grade: In.06Al.40Ga.54As | 540 |
| grade 1: 1875Å to In.125Al.40Ga.475As | 480 |
| grade 2: 1875Å to In.185Al.40Ga.415As | 400 |
| grade 3: 1875Å to In.248Al.40Ga.352As | 320 |
| grade 4: 1875Å to In.310Al.40Ga.29As | 310 |
| grade 5: 1875Å to In.373Al.40Ga.227As | 300 |
| grade 6: 1875Å to In.435Al.40Ga.165As | 290 |
| grade 7: 1875Å to In.498Al.40Ga.102As | 280 |
| grade 8: 1875Å to In.560Al.40Ga.04As | 270 |
| 1000Å In.52AlAs | 515 |
| 200Å In.60GaAs | 515 |
| 40Å In.52AlAs | 515 |
| 140Å In.40AlAs | 575 |
| 100Å In.53GaAs | 555 |
| 300Å N = 5E18 In.53GaAs | 520 |

In this example for the metamorphic buffer layer 16 growth, the indium concentration is linearly ramped from 6% to 56%. The compositional overshoot to 56% is incorporated to more completely relax the strain in the material. The 1000 Å $In_{0.52}Al_{0.48}As$ layer helps stabilize the lattice constant. The indium concentration at the start of the compositional ramp can be 5–10%. The compositional overshoot can be 3–10%. The metamorphic buffer layers used had thicknesses ranging from 1.0–1.8 μm.

Thus, in TABLE II, the metamorphic layer is competed with the completion of grade 8, active device layers are formed on such metamorphic buffer layer as shown in TABLE II.

Figure 2:
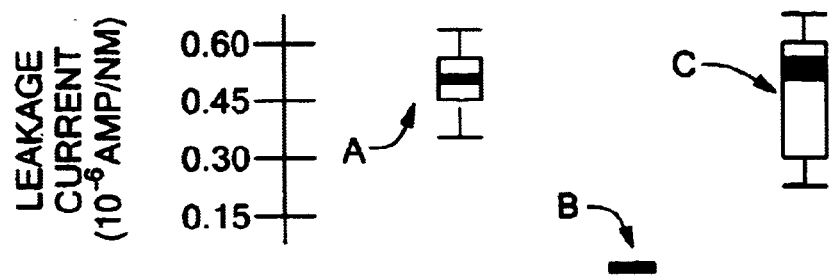
FIG. 2 shows leakage currents ($10^{-6}$ amp/mm) of three sets of structures having metamorphic buffer layers; four-wafer lots A and C contain a quaternary buffer layers according to the prior art and a four-wafer lot B contains a quaternary-ternary buffer layer of FIG. 1 according to the invention

An important characteristic of the metamorphic buffer layer is that it must be insulating to isolate different devices. Using the metamorphic buffer layer structure in TABLE II, transistors grown of such layer have experienced isolation problems. The buffer leakage current was measured by fabricating two closely spaced 100 μm×100 μm contact pads on the buffer layer. The source drain pads are separated by a 5 μm gap and the leakage current is measured with a 10 volt bias across the pads. Two sets of 4 wafers (Lots A and C) with the buffer layer in TABLE II were tested and the results are given in FIG. 2. FIG. 2 shows leakage currents ($10^{-6}$ amp/mm) of metamorphic buffer layers. Four-wafer lots A and C contain a quaternary buffer layers (TABLE II) and four-wafer lot B contains a quaternary-ternary buffer layer (TABLE I).

Leakage currents of $0.450\times10^{-6}$ amp/mm were measured, which is over an order of magnitude higher than desired. Attempts to increase the buffer resistivity by altering growth conditions did not produce acceptable device resistivity.

Due to excessive buffer leakage, the new metamorphic buffer layer described above in FIG. 1 and in TABLE I was developed. Here, as described above in FIG. 1 and in TABLE I, the buffer layer starts as an AlGaInAs quaternary with 40% aluminum content for good isolation and surface smoothness. After ramping the indium concentration to 25–30%, the material is switched to AlInAs to maintain good isolation. As a test, a buffer layer was grown using the structure of FIG. 1 and Table I. The surface smoothness of the quaternary-ternary buffer layer was measured with atomic force microscopy (AFM). The RMS roughness for a 25 μm×25 μm area was typically 10–11 Å, essentially the same as obtained with the conventional buffer layer in TABLE II. The buffer leakage was tested on a 4 wafer, Lot B in FIG. 2. where the Y-axis is $10^{-6}$ amp/mm and the plots are statistical plots of the measured data from 4 wafers of each of the 3 lots. The line in the middle of the rectangle is the median. The rectangle contains 50% of the data points (25% of the results greater and lesser than the median). The 2 stems extending outward from the rectangle contain 95% of the data.

As shown in FIG. 2, the leakage current was drastically reduced from $0.45\times10^{-6}$ amp/mm to $0.006\times10^{-6}$ amp/mm.

Figure 3:
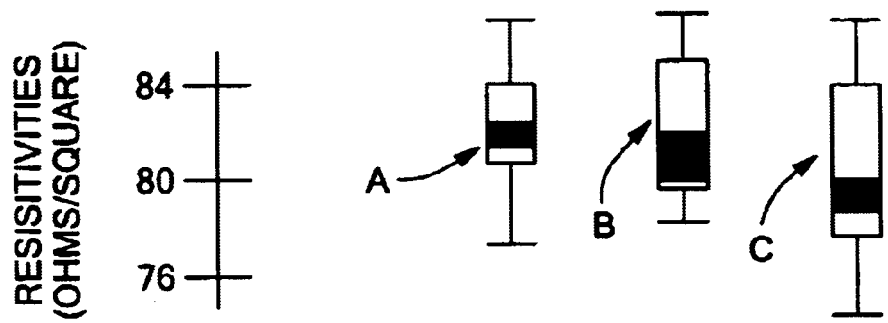
FIG. 3 shows sheet resistivities (ohms/square) of metamorphic high electron mobility transistors (MHEMTs) having active layers grown on quaternary metamorphic buffer layer according to the prior art lots A and C and quaternary-ternary metamorphic buffer layer, lot B, of FIG. 1 according to the invention.

Metamorphic high electron mobility transistor (HEMT) layers were grown on top of the new buffer layer shown in FIG. 1. FIG. 3 shows sheet resistivities of metamorphic high electron mobility transistors (MHEMTs) having active layers grown on quaternary metamorphic buffer layer according to the prior art lots A and C and quaternary-ternary metamorphic buffer layer, lot B, of FIG. 1 according to the invention where the Y-axis of is ohms/square.

Figure 4:
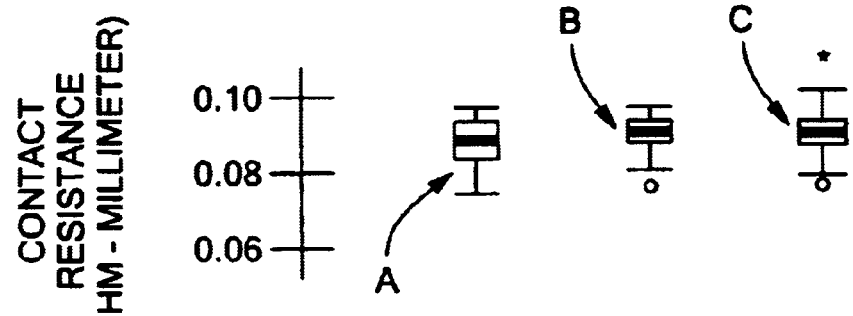
FIG. 4 shows contact resistances (ohm-millimeter) of the MHEMTs of FIGS. 2 and 3 having active layers grown on quaternary metamorphic buffer layer according to the prior art lots A and C and quaternary-ternary metamorphic buffer layer, lot B, of FIG. 1 according to the invention.

FIG. 4 shows contact resistances of the MHEMTs of FIG. 3 having the same active layers grown on quaternary metamorphic buffer layer according to the prior art lots A and C and quaternary-ternary metamorphic buffer layer, lot B, of FIG. 1 according to the invention. The device resistivities (ohms/square)(FIG. 3) and device contact resistances (ohm-millimeter) (FIG. 4) were not affected by the quaternary-ternary metamorphic buffer layer.

A number of embodiments of the invention have been described. Nevertheless, it will be understood that various modifications may be made without departing from the spirit and scope of the invention. For example, the final ramp in Table I is to In0.52Al0.48As. This metamorphic approach can be used to ramp the indium composition over the entire range (0–100%) to alter the lattice constant from GaAs to InAs. Additionally, the indium concentration in Table I at the transition point between the ternary and quaternary grade is 25%. Furthermore, the compositional grading described herein is linear grading. Step-grading to the quaternary and ternary compositions in Table I and FIG. 1 can also be used. Other concentrations for example between approximately 25%–35% can be used equally well. Accordingly, other embodiments are within the scope of the following claims.

What is claimed is:

1. A structure comprising:

a gallium arsenide semiconductor substrate;

a buffer layer disposed over the substrate, such buffer layer having a quaternary lower portion and a ternary upper portion; and wherein the quaternary lower portion of the buffer layer is compositionally graded AlGaInAs and the ternary upper portion of the buffer layer is compositionally graded AlInAs; and an active layer on the buffer layer such active layer having a transistor device therein.

2. The structure recited in claim 1 wherein the quaternary lower portion of the buffer layer has an approximate starting concentration of 5% indium, 40% aluminum, and 55% gallium (i.e., $In_{0.05}Al_{0.40}Ga_{0.55}As$).

3. The structure recited in claim 1 wherein the indium concentration is increased and the gallium concentration is decreased from a bottom of the quaternary lower portion of the buffer layer to a top of the quaternary lower portion of the buffer layer.

4. The structure recited in claim 3 wherein the top of the quaternary lower portion of the buffer layer has an indium concentration of approximately 25–35% and the gallium is terminated at the top of such upper portion of the quaternary lower portion of the buffer layer and wherein such structure includes an AlInAs layer on the top of the upper portion of the quaternary lower portion of the buffer layer.

5. The structure recited in claim 4 wherein the indium concentration is graded 3–10% beyond a predetermined indium concentration prior to the top of the upper portion of the ternary upper portion of the buffer layer and the indium concentration is reduced to the predetermined indium concentration at the top of the upper portion of the ternary upper portion of the buffer layer.

6. A gallium arsenide semiconductor substrate;

a buffer layer disposed on the substrate;

a metamorphic buffer layer disposed on the buffer layer, such metamorphic buffer layer comprising: a lower portion disposed on the buffer layer and an upper portion disposed on the lower portion of the metamorphic buffer layer, the lower portion of the metamorphic buffer layer comprising:

a starting composition of In.06Al.40Ga.54As;

graded to a final composition of In0.25Al0.40Ga0.35As and the upper portion of the metamorphic buffer layer comprising:

a starting composition of In0.25Al0.75As graded to In.56Al.44As and then graded to In.520Al.48As and an active layer on the buffer layer such active layer having a transistor device therein.

\* \* \* \* \*

UNITED STATES PATENT AND TRADEMARK OFFICE
CERTIFICATE OF CORRECTION

PATENT NO. : 6,818,928 B2
DATED : November 16, 2004
INVENTOR(S) : William E. Hoke It is certified that error appears in the above-identified patent and that said Letters Patent is hereby corrected as shown below:

Column 2,
Line 11, delete "low/high a" and replace with -- low/high, a --.
Line 49, delete "(i.e., A10.40In0.05Gao.55As" and replace with
-- (i.e., A10.40In0.05Ga0.55As. --.

Column 3,
Line 13, delete "buffer layers" and replace with -- buffer layer --.
Line 16, delete "invention" and replace with -- invention; --.
Line 19, delete "grown on quarternary" and replace with -- grown on a quarternary --.

Column 4,
Line 1, delete "In.520A148As" and replace with -- In.520A1.48As --.

Column 5,
Line 23, delete "buffer layers" and replace with -- buffer layer --.
Line 42, delete "FIG.2.where" and replace with -- FIG.2 where --.
Line 54, delete "grown on quarternary" and replace with -- grown on a quarternary --.
Line 57, delete "y-axis of is" and replace with -- y-axis is --.
Line 59, delete "grown on quarternary" and replace with -- grown on a quarternary --.

Column 6,
Line 3, delete "is to In0.52A10.48As." and replace with -- is I0.52A10.48As --.
Line 11, delete "concentrations for example" and replace with -- concentrations, for example, --.

Signed and Sealed this

Twenty-third Day of August, 2005

JON W. DUDAS
*Director of the United States Patent and Trademark Office*